United States Patent
Chae et al.

(10) Patent No.: US 12,506,062 B2
(45) Date of Patent: Dec. 23, 2025

(54) COMMUNICATION CHIP PACKAGE WITH ANTENNA AND HEAT DISSIPATION GROUND

(71) Applicant: Korea Electronics Technology Institute, Seongnam-si (KR)

(72) Inventors: Soo Chang Chae, Seongnam-si (KR); Ki Jin Kim, Hwaseong-si (KR); Kwang Ho Ahn, Yongin-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 111 days.

(21) Appl. No.: 18/521,056

(22) Filed: Nov. 28, 2023

(65) Prior Publication Data

US 2024/0178123 A1 May 30, 2024

(30) Foreign Application Priority Data

Nov. 29, 2022 (KR) ........................ 10-2022-0162165

(51) Int. Cl.
*H01Q 1/02* (2006.01)
*H01L 23/00* (2006.01)
*H01L 23/34* (2006.01)
*H01L 23/498* (2006.01)
(Continued)

(52) U.S. Cl.
CPC ........ *H01L 23/49838* (2013.01); *H01L 23/34* (2013.01); *H01L 24/48* (2013.01); *H01Q 1/02* (2013.01); *H01Q 9/0457* (2013.01); *H05K 1/0206* (2013.01); *H01L 2224/48091* (2013.01); *H01L 2224/48227* (2013.01)

(58) Field of Classification Search
None
See application file for complete search history.

(56) References Cited

U.S. PATENT DOCUMENTS

| | | |
|---|---|---|
| 2008/0157344 A1 | 7/2008 | Chen et al. |
| 2018/0159203 A1* | 6/2018 | Baks ..................... H01Q 9/045 |
| 2022/0140794 A1* | 5/2022 | Brewer ................. H01L 23/552 |
| | | 330/295 |

FOREIGN PATENT DOCUMENTS

| | | |
|---|---|---|
| JP | 11-87852 A | 3/1999 |
| KR | 10-2002-0086000 A | 11/2002 |
| KR | 10-1208241 B1 | 12/2012 |

OTHER PUBLICATIONS

Korean Office Action issued on Jan. 30, 2024, in counterpart Korean Patent Application No. 10-2022-0162165 (4 pages in English, 5 pages in Korean).

* cited by examiner

*Primary Examiner* — Henry Luong
(74) *Attorney, Agent, or Firm* — NSIP Law

(57) ABSTRACT

There is provided a communication chip package integrating an antenna and a heat dissipation ground. In the integrated package according to an embodiment, a heat dissipation ground is coupled to a high frequency communication chip package, an antenna patch is directly disposed on an upper portion of a mold of a ceramic material, changes are made to the structure of the ceramic mold to minimize a wire bonding length to a communication chip, a capacitive power feeding method is applied through a sidewall of the ceramic mold, and heat is discharged through a lower portion of the package and also through a PCB or an additional heat dissipation structure of a lower portion of the PCB. Accordingly, an insertion loss may be minimized and an effect of heat dissipation may be maximized.

20 Claims, 8 Drawing Sheets

(51) Int. Cl.
*H01Q 9/04* (2006.01)
*H05K 1/02* (2006.01)

COMMUNICATION CHIP PACKAGE WITH ANTENNA AND HEAT DISSIPATION GROUND

CROSS-REFERENCE TO RELATED APPLICATION(S) AND CLAIM OF PRIORITY

This application is based on and claims priority under 35 U.S.C. § 119 to Korean Patent Application No. 10-2022-0162165, filed on Nov. 29, 2022, in the Korean Intellectual Property Office, the disclosure of which is herein incorporated by reference in its entirety.

BACKGROUND

Field

The disclosure relates to a semiconductor package technology, and more particularly, to a communication chip package for high-frequency communication or radio detection and ranging (RADAR).

Description of Related Art

In the case of semiconductors that operate at high frequency and consumes high power, Micro Lead Frame (MLF) semiconductor packages as shown in FIG. 1 are mostly used. A MLF package has a ground plane disposed therein to discharge heat and has a chip attached on the ground plane, thereby having good heat dissipation characteristics. However, a length of a wire bonding from the chip to a signal pad is so long that a bonding inductance increases, and accordingly, there is a demerit that a signal loss occurs. Therefore, there is a problem that, as an operating frequency of the chip increases, the package is more difficult to use.

A structure that is mostly used in high-output radio frequency (RF) semiconductor packages is the wafer level package (WLP) shown in FIG. 2. According to a process of putting a ball on a chip, there are a fan-in WLP in which balls are placed to suit a size of a chip, and a fan-out WLP in which an area for placing balls is larger than a size of a chip. An MLF structure uses a wire bonding, whereas a WLP uses a ball. Accordingly, the WLP may reduce a loss in connecting a signal (wire bonding inductance>ball inductance), and is more advantageous in terms of loss than the MLF when the operating frequency of the chip increases. However, the WLP is not a structure that has a semiconductor directly attached to a heat dissipation plate like the MLF package, and thus is inferior in heat dissipation characteristics.

FIG. 3 is a view illustrating a state in which a package is connected to an antenna module through MLP or WLP and the antenna module is assembled with a printed circuit board (PCB). Any package should be connected to an antenna through a long loss of a package module, which results in a high insertion loss between an RF package and an antenna. Meanwhile, a packaged chip may be coupled with an antenna package module and then may be connected to a PCB through a solder ball. Therefore, if heat treatment is performed on the PCB, there is a high possibility that a heating problem arises due to a very high thermal resistance.

SUMMARY

The disclosure has been developed in order to solve the above-described problems, and an object of the disclosure is to provide a design structure for solving a heating problem of a communication chip and an insertion loss problem of an antenna in a package in which a plurality of antenna patches for beamforming are coupled to a high-frequency communication chip.

According to an embodiment of the disclosure to achieve the above-described object, a communication chip package may include: a communication chip configured to perform high frequency communication; a ceramic mold formed in such a shape that the ceramic mold encloses side surfaces and an upper portion of the communication chip; a patch antenna disposed on an upper surface of the ceramic mold; and a heat dissipation ground disposed on a lower portion of the communication chip.

A part of the ceramic mold that is adjacent to the communication chip may protrude toward the communication chip, and a pad may be formed on an upper surface of the protruding area to be connected with the communication chip through a wire bonding.

A part of the protruding area may be positioned on an upper portion of the heat dissipation ground.

A height of an upper surface of the protruding area may be the same as a height of an upper surface of the communication chip.

According to the disclosure, the communication chip package may include a power feeding unit formed in a side wall of the ceramic mold to feed power to the patch antenna in a capacitive feeding method.

The heat dissipation ground may be formed within a sidewall of the ceramic mold.

The heat dissipation ground may be connected with a ground of a PCB to which the communication chip package is coupled through a via hole.

The heat dissipation ground may penetrate through a PCB to which the package is coupled.

The heat dissipation ground may be connected with an additional heat dissipation structure under the PCB.

According to another aspect of the disclosure, there is provided a communication chip package including: a communication chip configured to perform high frequency communication; a mold formed in such a shape that the mold encloses side surfaces and an upper portion of the communication chip, a part of the mold that is adjacent to the communication chip protruding toward the communication chip; a pad is formed on an upper surface of the protruding area of the mold to be connected with the communication chip through a wire bonding; and a heat dissipation ground disposed on a lower portion of the communication chip.

According to still another aspect of the disclosure, there is provided a communication chip package including: a communication chip configured to perform high frequency communication; a mold formed in such a shape that the mold encloses side surfaces and an upper portion of the communication chip; a patch antenna disposed on an upper surface of the mold; and a power feeding unit formed in a side wall of the mold to feed power to the patch antenna in a capacitive feeding method.

According to yet another aspect of the disclosure, there is provided a communication chip package including: a communication chip configured to perform high frequency communication; a heat dissipation ground disposed on a lower portion of the communication chip; and a mold formed in such a shape that the mold encloses side surfaces and an upper portion of the communication chip, and encloses side surfaces of the heat dissipation ground, and exposes a lower portion of the heat dissipation ground to an outside.

According to embodiments of the disclosure described above, a heat dissipation ground may be coupled to a high frequency communication chip package, thereby dissipating heat effectively through a lower portion of the package and also through a PCB or an additional heat dissipation structure of a lower portion of the PCB, and solving a heating problem in a communication chip.

In addition, according to embodiments of the disclosure, an antenna patch is directly disposed on an upper portion of a mold of a ceramic material, and changes are made to the structure of the ceramic mold to minimize a wire bonding length to a communication chip, and a capacitive power feeding method is applied through a sidewall of the ceramic mold, so that an insertion loss is minimized.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Hereinafter, the disclosure will be described in more detail with reference to the accompanying drawings.

Embodiments of the disclosure provide a structure of a communication chip package which integrates patch antennas for beamforming and a heat dissipation ground. Embodiments provide a design structure for solving a heating problem of a communication chip and an insertion loss problem of an antenna.

Figure 4:
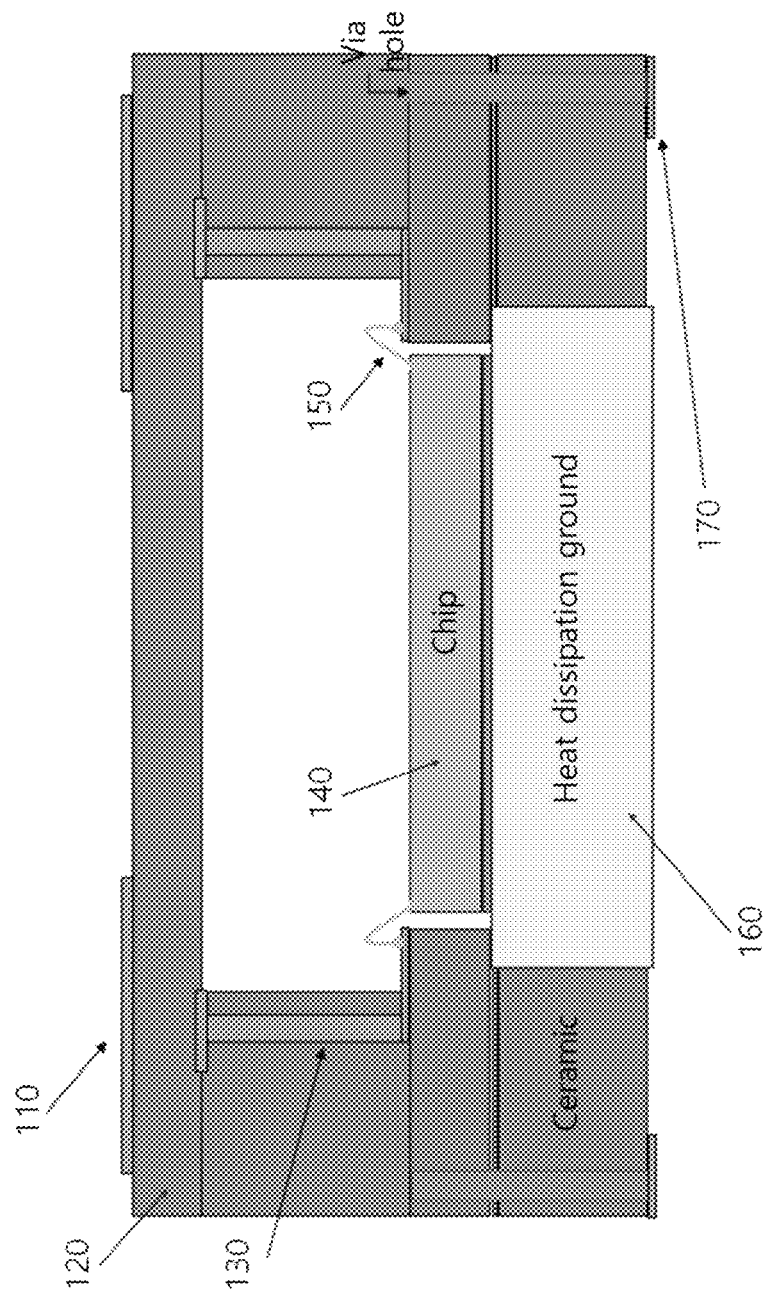
FIG. 4 is a cross-sectional view of an integrated package according to an embodiment of the disclosure.
Figure 5:
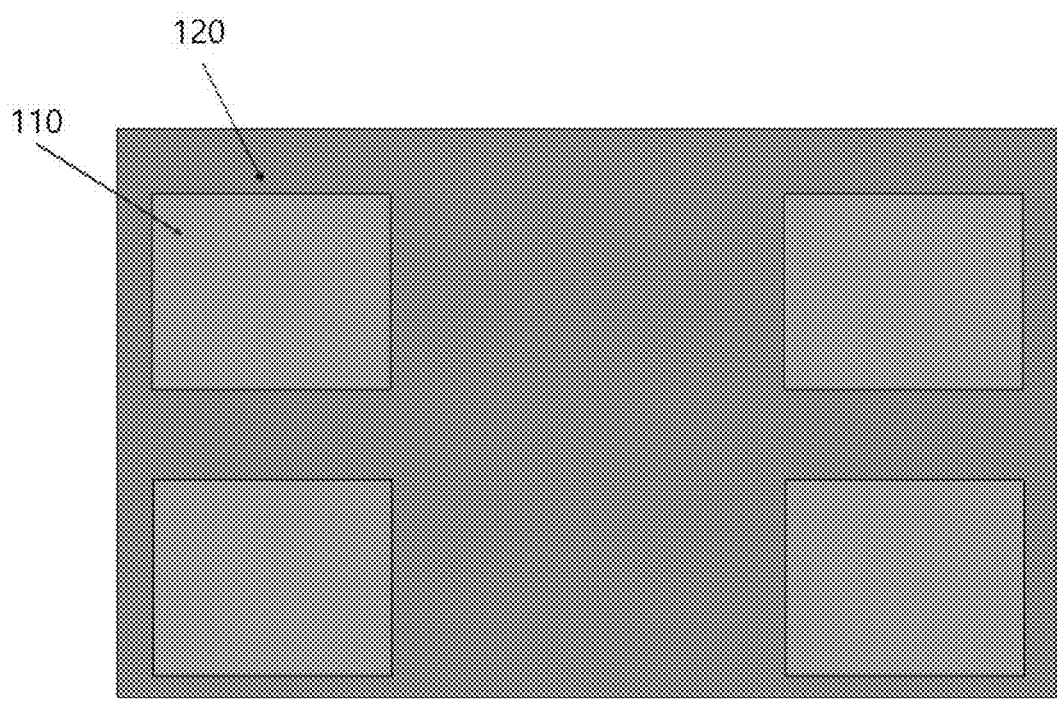
FIG. 5 is a top view of the integrated package according to an embodiment of the disclosure.
Figure 6:
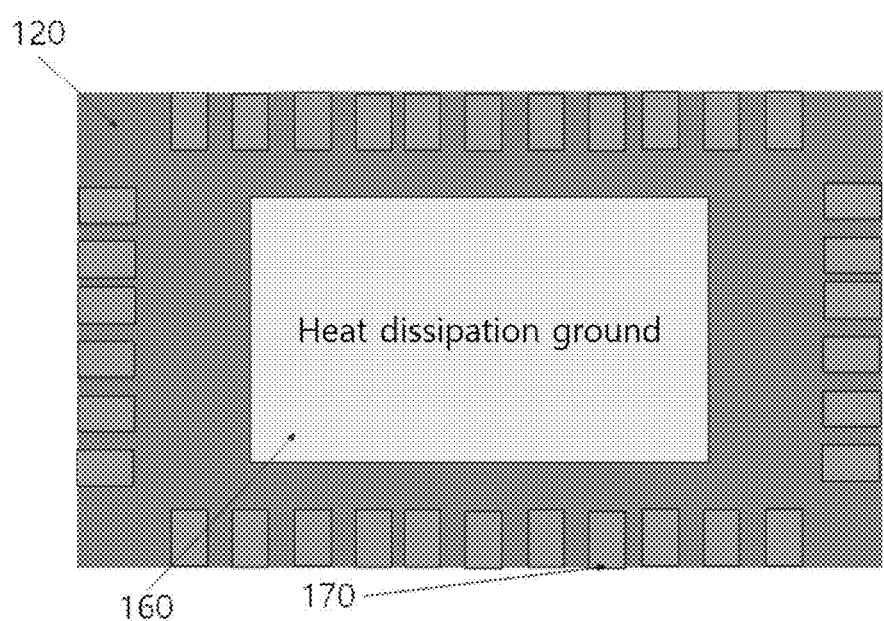
FIG. 6 is a bottom view of the integrated package according to an embodiment of the disclosure.

FIGS. 4, 5, and 6 are views illustrating a structure of a communication chip package that integrates an antenna and a heat dissipation ground (hereinafter, referred to as an "integrated package") according to an embodiment of the disclosure. Specifically, FIG. 4 is a cross-sectional view of the integrated package, FIG. 5 is a top view of the integrated package as viewed from above, and FIG. 6 is a top view of the integrated package as viewed from below.

As shown in the drawings, the integrated package according to an embodiment may include a patch antenna 110, a ceramic mold 120, a power feeding unit 130, a communication chip 140, a wire bonding 150, a heat dissipation ground 160, and a signal pad 170.

The communication chip 140 is a chip for RF communication of a high frequency, RADAR communication, and there is no limit to communication purposes. The heat dissipation ground 160 may be disposed below the communication chip 140 to discharge heat generated in the communication chip 140 downwardly.

Like a related-art MLF structure, the integrated package according to an embodiment has the heat dissipation ground 160 coupled to a lower portion of the communication chip 140 to discharge heat, so that a heating problem of the communication chip 140 may be solved.

The ceramic mold 120 is manufactured with a ceramic material in such a shape that the ceramic mold 120 encloses side surfaces and an upper portion of the communication chip 140. The heat dissipation ground 160 may also be formed within a sidewall of the ceramic mold 120.

A portion of the ceramic mold 120 that is adjacent to the communication chip 140 protrudes toward the communication chip 110. Accordingly, a part of the protruding area of the ceramic mold 120 is positioned on an upper portion of the heat dissipation ground 160.

A height of the upper surface of the protruding area of the ceramic mold 120 is the same as a height of the upper surface of the communication chip 140. A pad is formed on the upper surface of the protruding area of the ceramic mold 120 to be coupled with the communication chip 140 through the wire bonding 150. The wire bonding 150 may be implemented with a short length due to the presence of the protruding area of the ceramic mold 120.

Figure 1:
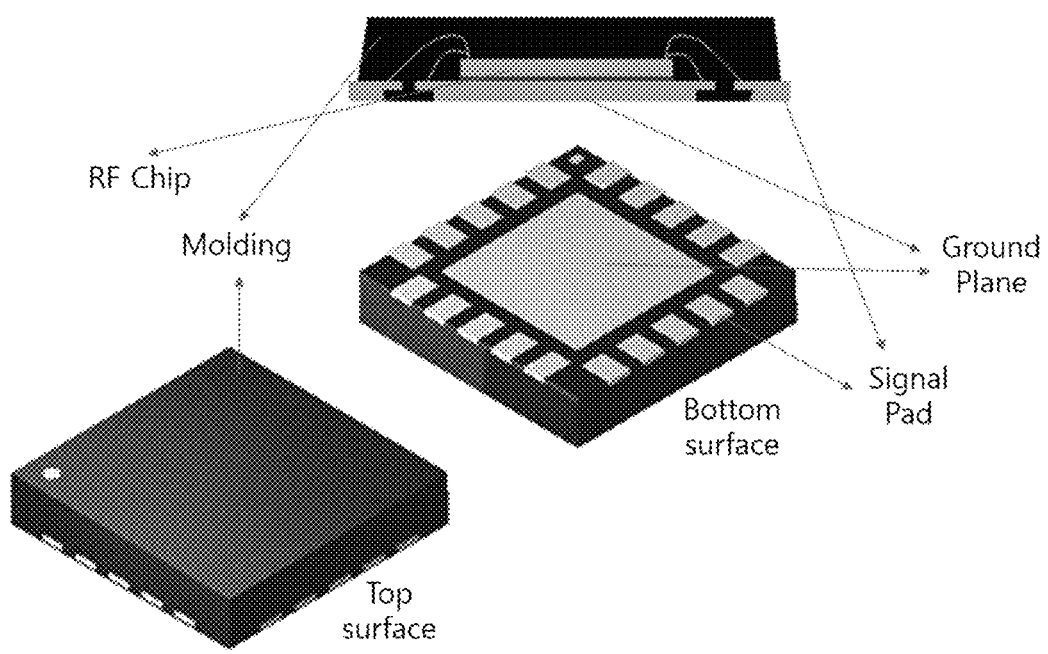
FIG. 1 is a view illustrating an MLF semiconductor package.
Figure 2:
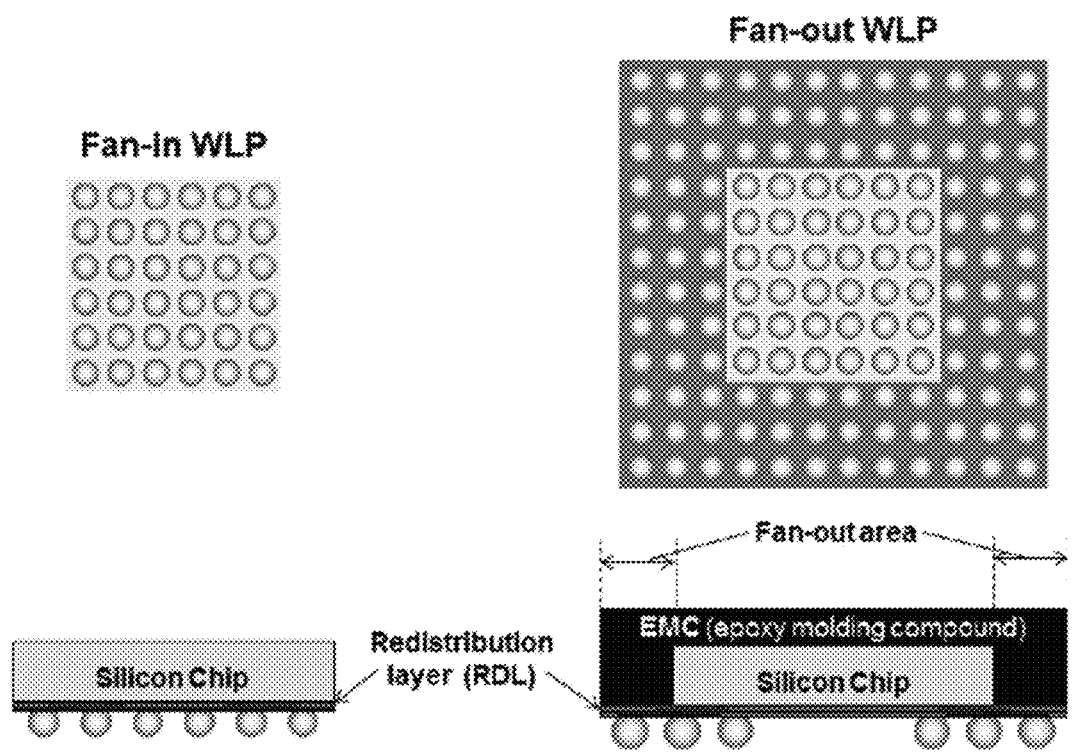
FIG. 2 is a view illustrating a wafer level package.

Unlike the related-art MLF structure presented in FIG. 1 in which a signal path (wire bonding) is connected over a heat dissipation ground and thus a great insertion loss is caused, the integrated package according to an embodiment has the ceramic mold 120 protruding further inward than the heat dissipation ground 160, being close to the communication chip 140, so that an insertion loss may be minimized with the short wire boding 150.

The patch antenna 110 may be disposed on an upper surface of the ceramic mold 120. The power feeding unit 130 for feeding power to the patch antenna 110 may be disposed within a sidewall of the ceramic mold 120 to feed power to the patch antenna 110 in a capacitive feeding method.

Figure 3:
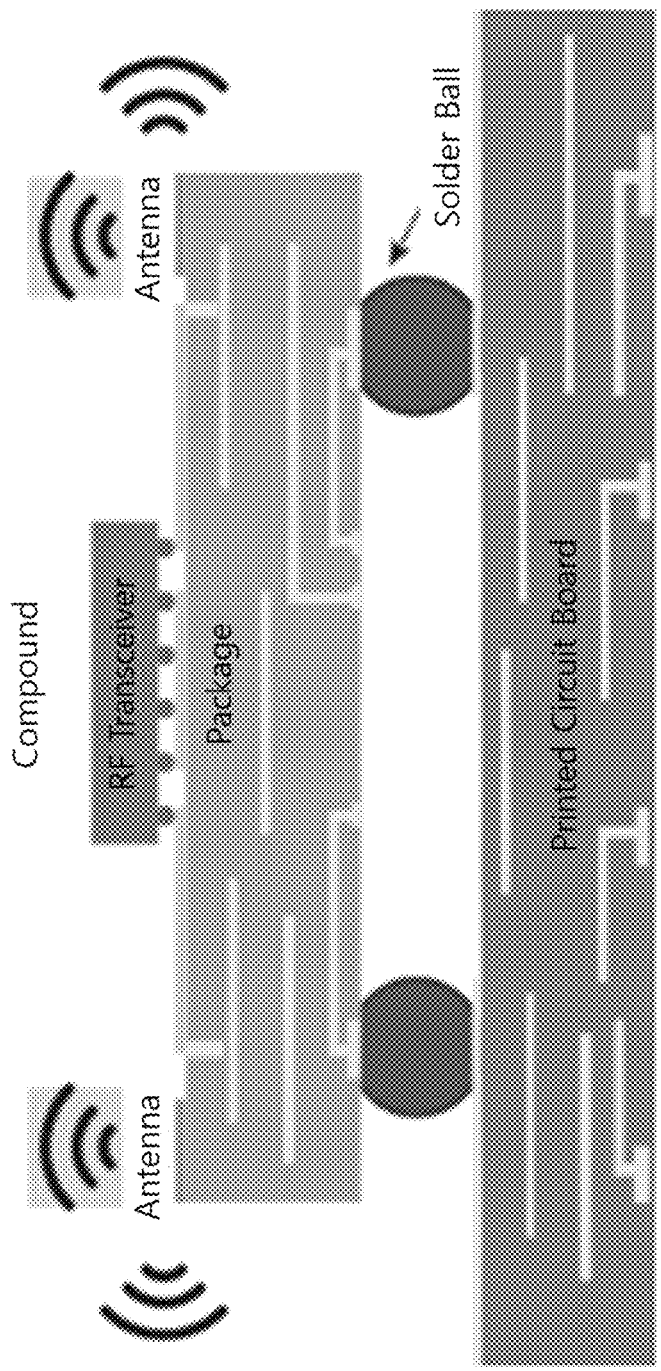
FIG. 3 is a view illustrating coupling of a packaged RF chip, an antenna module, and a PCB.

The related-art structure presented in FIG. 3 may cause an additional insertion loss in a process of routing from the packaged communication chip to the antenna. This problem may arise when a separate antenna is disposed on a substrate having high Q although Q of a package mold material is so low that it is not appropriate to design an antenna. On the other hand, the integrated package according to an embodiment uses a ceramic material having a high Q value as a mold material, and has the patch antenna 110 directly disposed on the upper surface of the ceramic mold 120.

In addition, in order to stably feed power to the patch antenna 110 disposed on the upper surface of the ceramic mold 120, the power feeding unit 130 and the patch antenna 110 may be connected in a capacitive coupling method without being directly connected. This may reduce a physical length from the communication chip 140 to the patch antenna 110, and the power feeding unit 130 may be implemented in a symmetrical shape to solve an insertion loss.

As shown in FIG. 6, the heat dissipation ground 160 occupies a wide area of the center of the integrated package according to an embodiment, and the signal pads 170 are arranged along an outer edge. The signal pad 170 may be configured to electrically connect between a PCB and the communication chip 140, and the signal pad 170 and the communication chip 140 may be connected through a via hole formed within a sidewall of the ceramic mold 120, so that an insertion loss is smaller than in a related-art MFV via.

Figure 7:
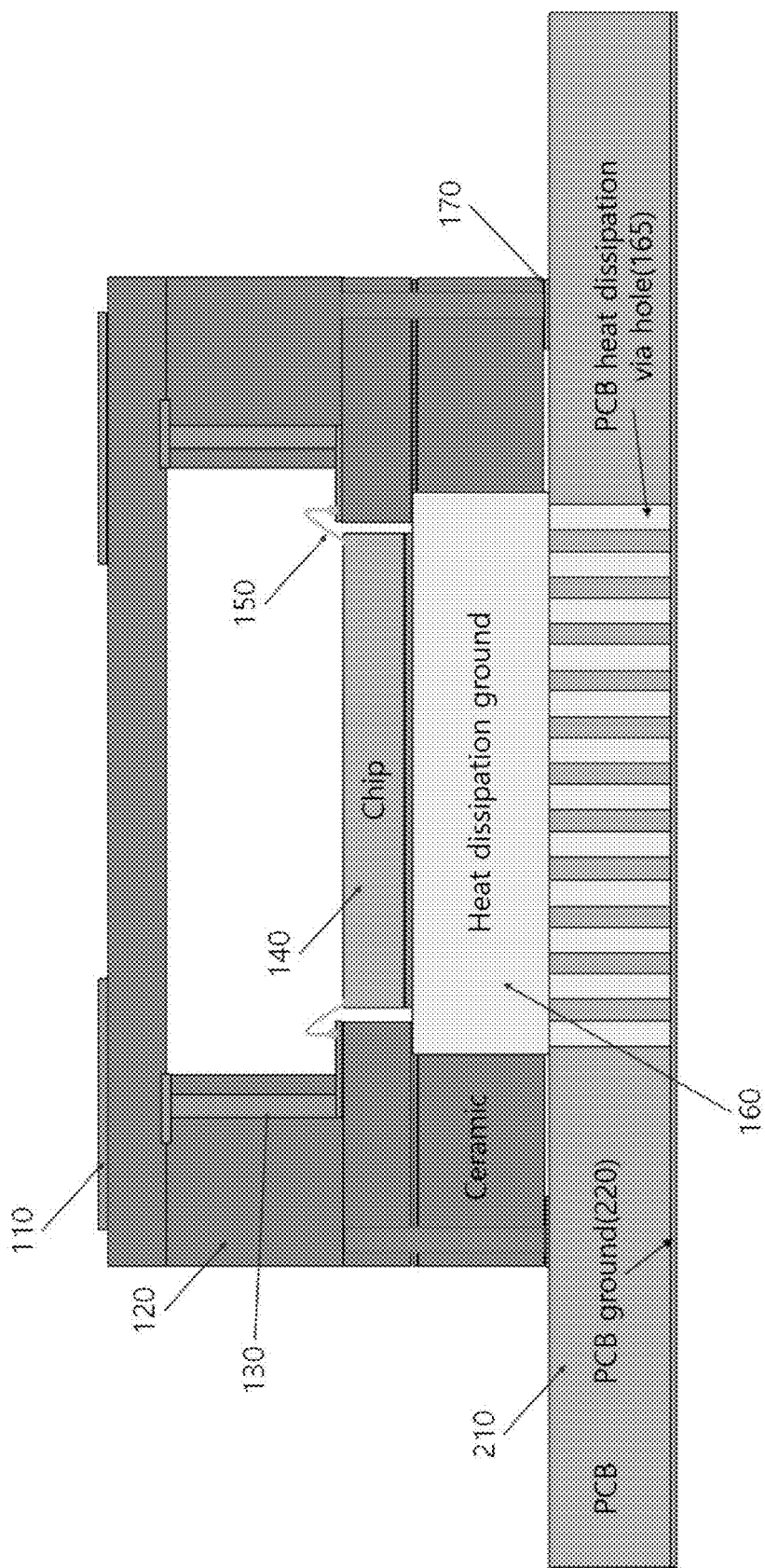
FIG. 7 is a view illustrating a heat dissipation structure when an integrated package and a PCB are coupled to each other according to another embodiment of the disclosure.

FIG. 7 is a view illustrating a structure of an integrated package according to another embodiment. The integrated package according to another embodiment may have a PCB heat dissipation via 165 added to a lower portion of the heat dissipation ground 160.

The PCB heat dissipation via 165 penetrates through a PCB 210 to which the integrated package is coupled, thereby connecting the heat dissipation ground 160 and a PCB ground 220. Accordingly, heat radiated from the communication chip 140 may be discharged through the heat dissipation ground 160, the PCB heat dissipation via 165, and the PCB ground 220 in sequence.

Figure 8:
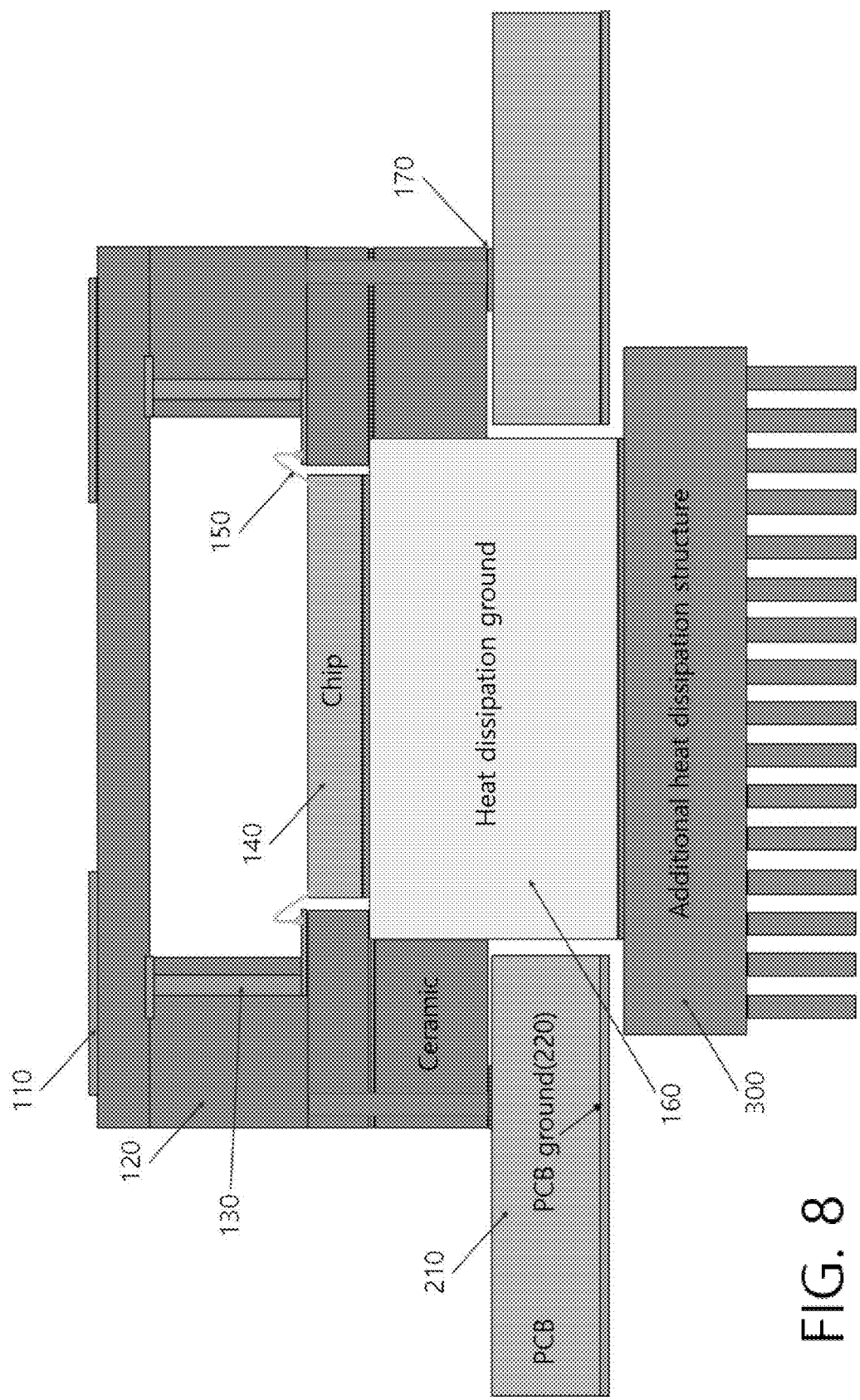
FIG. 8 is a view illustrating a structure applying an additional heat dissipation structure when an integrated package and a PCB are coupled to each other according to another embodiment of the disclosure.

FIG. 8 is a view illustrating a structure of an integrated package according to still another embodiment of the disclosure. The integrated package according to still another embodiment may be implemented such that the heat dissipation ground 160 is extended downward to be lower than a lower surface of the ceramic mold 120 and penetrates through the PCB 210 on which the integrated package is mounted.

In addition, the heat dissipation ground 160 may be connected to an additional heat dissipation structure 300 under the PCB 210. Accordingly, heat radiated from the communication chip 140 is discharged through the heat dissipation ground 160 and the additional heat dissipation structure 300 in sequence.

The integrated package according to embodiments is a package structure that is applicable to a high-output or high-array antenna system. If there is a restriction to heat dissipation characteristics in the PCB 210, a hole may be formed on the PCB 210 and the heat dissipation ground 160 may be made to penetrate through the hole to protrude to a lower surface of the PCB 210, so that a heating restriction problem may be solved.

Up to now, a communication chip package integrating an antenna and a heat dissipation ground has been described in detail with reference to preferred embodiments.

In the above-described embodiments, a heat dissipation ground may be coupled to a high frequency communication chip package, thereby dissipating heat effectively through a lower portion of the package and also through a PCB or an additional heat dissipation structure of a lower portion of the PCB, and solving a heating problem in a communication chip.

In addition, an antenna patch is directly disposed on an upper portion of a mold of a ceramic material, and changes are made to the structure of the ceramic mold to minimize a wire bonding length to a communication chip, and a capacitive power feeding method is applied through a sidewall of the ceramic mold, so that an insertion loss is minimized.

The package according to embodiments may be applicable to a beamforming system for high frequency RF communication, 5G, RADAR, etc.

In addition, while preferred embodiments of the present disclosure have been illustrated and described, the present disclosure is not limited to the above-described specific embodiments. Various changes can be made by a person skilled in the at without departing from the scope of the present disclosure claimed in claims, and also, changed embodiments should not be understood as being separate from the technical idea or prospect of the present disclosure.

What is claimed is:

1. A communication chip package comprising:
    a communication chip configured to perform high frequency communication;
    a ceramic mold formed in such a shape that the ceramic mold encloses side surfaces and an upper portion of the communication chip;
    a patch antenna disposed on an upper surface of the ceramic mold;
    a heat dissipation ground disposed on a lower portion of the communication chip; and
    a power feeding unit formed in a side wall of the ceramic mold to feed power to the patch antenna in a capacitive feeding method.

2. The communication chip package of claim 1, wherein a part of the ceramic mold that is adjacent to the communication chip protrudes toward the communication chip, and
    wherein a pad is formed on an upper surface of the protruding area to be connected with the communication chip through a wire bonding.

3. The communication chip package of claim 2, wherein a part of the protruding area is positioned on an upper portion of the heat dissipation ground.

4. The communication chip package of claim 2, wherein a height of an upper surface of the protruding area is the same as a height of an upper surface of the communication chip.

5. The communication chip package of claim 1, wherein the heat dissipation ground is formed within a sidewall of the ceramic mold.

6. The communication chip package of claim 5, wherein the heat dissipation ground is connected with a ground of a PCB to which the communication chip package is coupled through a via hole.

7. The communication chip package of claim 5, wherein the heat dissipation ground penetrates through a PCB to which the package is coupled.

8. The communication chip package of claim 7, wherein the heat dissipation ground is connected with an additional heat dissipation structure under the PCB.

9. A communication chip package comprising:
    a communication chip configured to perform high frequency communication;
    a mold formed in such a shape that the mold encloses side surfaces and an upper portion of the communication chip, a part of the mold that is adjacent to the communication chip protruding toward the communication chip;

a pad formed on an upper surface of the protruding area of the mold to be connected with the communication chip through a wire bonding;

a heat dissipation ground disposed on a lower portion of the communication chip; and a power feeding unit formed in a side wall of the ceramic mold to feed power to the patch antenna in a capacitive feeding method.

10. A communication chip package comprising:

a communication chip configured to perform high frequency communication;

a mold formed in such a shape that the mold encloses side surfaces and an upper portion of the communication chip;

a patch antenna disposed on an upper surface of the mold; and a power feeding unit formed in a side wall of the mold to feed power to the patch antenna in a capacitive feeding method.

11. The communication chip package of claim 10, wherein a part of the ceramic mold that is adjacent to the communication chip protrudes toward the communication chip, and wherein a pad is formed on an upper surface of the protruding area to be connected with the communication chip through a wire bonding.

12. The communication chip package of claim 11, wherein a part of the protruding area is positioned on an upper portion of the heat dissipation ground.

13. The communication chip package of claim 11, wherein a height of an upper surface of the protruding area is the same as a height of an upper surface of the communication chip.

14. The communication chip package of claim 10, wherein the heat dissipation ground is formed within a sidewall of the ceramic mold.

15. The communication chip package of claim 14, wherein the heat dissipation ground is connected with a ground of a PCB to which the communication chip package is coupled through a via hole.

16. The communication chip package of claim 14, wherein the heat dissipation ground penetrates through a PCB to which the package is coupled.

17. The communication chip package of claim 14, wherein the heat dissipation ground is connected with an additional heat dissipation structure under the PCB.

18. The communication chip package of claim 9, wherein a part of the protruding area is positioned on an upper portion of the heat dissipation ground.

19. The communication chip package of claim 9, wherein a height of an upper surface of the protruding area is the same as a height of an upper surface of the communication chip.

20. The communication chip package of claim 9, wherein the heat dissipation ground is formed within a sidewall of the ceramic mold.

* * * * *